United States Patent
Hayashiya

(10) Patent No.: US 12,120,183 B2
(45) Date of Patent: Oct. 15, 2024

(54) COMMUNICATION SYSTEM, OPTICAL TRANSMISSION DEVICE, AND COMMUNICATION METHOD

(71) Applicant: HOKUYO AUTOMATIC CO., LTD., Osaka (JP)

(72) Inventor: Toshiaki Hayashiya, Osaka (JP)

(73) Assignee: HOKUYO AUTOMATIC CO., LTD., Osaka (JP)

( * ) Notice: Subject to any disclaimer, the term of this patent is extended or adjusted under 35 U.S.C. 154(b) by 196 days.

(21) Appl. No.: 17/963,538

(22) Filed: Oct. 11, 2022

(65) Prior Publication Data
US 2023/0123727 A1 Apr. 20, 2023

(30) Foreign Application Priority Data

Oct. 14, 2021 (JP) ................................ 2021-168985

(51) Int. Cl.
| | |
|---|---|
| H04B 10/40 | (2013.01) |
| H01L 21/677 | (2006.01) |
| H04B 10/114 | (2013.01) |
| H04L 67/12 | (2022.01) |

(52) U.S. Cl.
CPC ............ *H04L 67/12* (2013.01); *H04B 10/114* (2013.01); *H04B 10/40* (2013.01); *H01L 21/67724* (2013.01)

(58) Field of Classification Search
CPC ............................................. H05K 2203/0147
See application file for complete search history.

(56) References Cited

U.S. PATENT DOCUMENTS

| | | | | |
|---|---|---|---|---|
| 8,287,222 B2* | 10/2012 | Sawado | ............ | H01L 21/67775 700/228 |
| 8,620,469 B2* | 12/2013 | Kuroyanagi | ...... | H01L 21/67736 700/56 |
| 9,866,321 B2* | 1/2018 | Oh | ........................ | H04B 10/114 |
| 10,822,006 B2* | 11/2020 | Berger | ................. | H04B 10/548 |
| 11,212,951 B2* | 12/2021 | Kondo | ................. | H05K 13/086 |
| 11,765,877 B2* | 9/2023 | Yasui | ................. | H05K 13/0857 29/739 |

(Continued)

FOREIGN PATENT DOCUMENTS

JP 2016118845 A * 6/2016

*Primary Examiner* — Jai M Lee
(74) *Attorney, Agent, or Firm* — Oliff PLC

(57) ABSTRACT

A communication system for transmitting and receiving signals between an automated guided vehicle and a load port of a substrate processing device includes a first communication unit having a plurality of first communication parts configured to perform optical communication with the automated guided vehicle and connected to each other via a first communication line, and a second communication unit having a plurality of second communication parts respectively connected to a plurality of load ports and connected to each other via a second communication line. The plurality of first communication parts each constitute a pair with a predetermined one of the plurality of second communication parts. Also, one of the plurality of pairs is set as a communication pair, and signals are transmitted and received between the plurality of first communication parts and the plurality of second communication parts via the communication pair.

12 Claims, 7 Drawing Sheets

(56) References Cited

U.S. PATENT DOCUMENTS

2002/0150448 A1* 10/2002 Mizokawa ........ H01L 21/67161
 414/217
2021/0265184 A1* 8/2021 Kitamura .......... H01L 21/67733
2023/0051556 A1* 2/2023 Nozawa ............... H05K 13/086

* cited by examiner

COMMUNICATION SYSTEM, OPTICAL TRANSMISSION DEVICE, AND COMMUNICATION METHOD

BACKGROUND OF THE INVENTION

1. Field of the Invention

The present invention relates to a communication system, an optical transmission device and a communication method.

2. Description of Related Art

In semiconductor manufacturing plants, an automated transport system is utilized to transport semiconductor wafers. In the automated transport system, automated guided vehicles perform transportation of carriers (e.g., FOUPs: Front Opening Unified Pods) housing semiconductor wafers, and delivery (loading and reception) of carriers to load ports of a substrate processing device (e.g., semiconductor manufacturing device), for example.

The automated guided vehicles communicate with the substrate processing device while delivering carriers to the load ports. For example, at the time of loading a carrier onto a load port from an automated guided vehicle, the automated guided vehicle moves to a predetermined position, and then starts communication with the load port and checks whether the load port is ready to receive the carrier. After confirming that the load port is ready to receive the carrier, the automated guided vehicle loads the carrier onto the load port.

Conventionally, in an automated transport system such as described above, optical communication is utilized to perform communication between an automated guided vehicle and a load port. For example, a manufacturing system disclosed in JP 2016-118845A includes an overhead travel vehicle (automated guided vehicle) and a plurality of manufacturing devices. The manufacturing devices each include a plurality of load ports. The overhead travel vehicle includes an optical IO (hereinafter, vehicle-side optical JO). An optical IO (hereinafter, port-side optical IO) is connected to each load port. A port-side optical JO is provided for every load port.

In the manufacturing system of JP 2016-118845A, the overhead travel vehicle is able to check whether each load port is ready to receive a carrier, by communicating with the load port via the vehicle-side optical IO and the port-side optical IO.

JP 2016-118845A is an example of related art.

Incidentally, in the manufacturing system of JP 2016-118845A, the port-side optical IO and the load port are connected by a cable. Also, as described above, in the manufacturing system of JP 2016-118845A, a port-side optical IO needs to be provided for every load port. In the manufacturing system of JP 2016-118845A, the load ports and the port-side optical IOs thus need to be respectively connected separately, and this task takes time. Also, crosstalk caused by noise could possibly occur between the communication lines respectively connecting the load ports and the port-side optical IOs.

In view of this, an example object of the present invention is to provide a communication system, an optical transmission device and a communication method that are able to simplify the wiring between an automated guided vehicle and the load ports of a substrate processing device.

SUMMARY OF THE INVENTION (1) In order to achieve the above object, a communication system according to one aspect of the present invention is a communication system for transmitting and receiving signals between an automated guided vehicle and a load port of a substrate processing device, including a first communication unit having a plurality of first communication parts configured to perform optical communication with the automated guided vehicle and connected to each other via a first communication line, and a second communication unit having a plurality of second communication parts respectively connected to a plurality of load ports and connected to each other via a second communication line. The plurality of first communication parts each constitute a pair with a predetermined one of the plurality of second communication parts. Also, one of the plurality of pairs is set as a communication pair, and signals are transmitted and received between the plurality of first communication parts and the plurality of second communication parts via the communication pair.

In the communication system having the above configuration, the plurality of first communication parts of the first communication unit and the plurality of second communication parts of the second communication unit can be connected in one line for communication by setting one pair as a communication pair. The wiring between the automated guided vehicle and the plurality of load ports can thereby be simplified. Specifically, the plurality of first communication parts and the plurality of second communication parts do not need to be respectively connected separately. The task of connecting the first communication unit and the second communication unit is thus facilitated, and crosstalk caused by noise can be prevented from occurring at the time of transmitting and receiving signals between the first communication unit and the second communication unit.

Note that, normally, the spacing between adjacent load ports is sufficiently smaller than the spacing between the first communication parts and the second communication parts which are generally installed apart from each other. Also, normally, the first communication parts and the second communication parts are provided in correspondence with the load ports, and thus the spacing between adjacent first communication parts and the spacing between adjacent second communication parts are also sufficiently smaller than the spacing between the first communication parts and the second communication parts that are installed apart from each other. In this regard, in the present invention, a first communication line connecting the plurality of first communication parts and a second communication line connecting the plurality of second communication parts will be required, but, as described above, the plurality of first communication parts and the plurality of second communication parts do not need to be respectively connected separately. For example, laying of a plurality of long communication lines can be eliminated, compared to the case where long communication lines are laid to respectively connect the plurality of first communication parts and the plurality of second communication parts separately, and thus the total length of the communication lines can be shortened in the communication system as a whole. The installation cost of the communication system can thereby be reduced.

Also, space for the automated guided vehicle to move needs to be secured between the first communication unit and the second communication unit. In this regard, in the present invention, the plurality of first communication parts and the plurality of second communication parts do not need to be respectively connected separately as described above. In this case, the degree of freedom in the layout of the communication system is increased, compared to the case where the plurality of first communication parts and the plurality of second communication parts are respectively connected separately. Space for the automated guided vehicle to move can thereby be easily secured between the first communication unit and the second communication unit. As a result, the task of installing of the communication system is facilitated.

(2) In the communication system of (1) above, the automated guided vehicle may be an overhead hoist transport configured to move along a track provided at a position upward of the plurality of load ports, and the plurality of first communication parts may be provided along the track at positions upward of the plurality of load ports and to be separated from each other. In the case of using an overhead hoist transport, the spacing between the track of the automated guided vehicle and the load ports is generally larger. In this case, the spacing between the first communication unit that is provided at a high position upward of the load ports and the second communication unit is also larger. However, in the present invention, the plurality of first communication parts and the plurality of second communication parts do not need to be respectively connected separately as described above. In other words, a plurality of long communication lines do not need to be laid to connect the plurality of first communication parts and the plurality of second communication parts separately. Even if the spacing between the first communication unit and second communication unit that are installed apart from each other increases, the first communication unit and the second communication unit can thus be easily connected, compared to the case where the plurality of first communication parts and the plurality of second communication parts are respectively connected separately. Also, the total length of the communication lines can be sufficiently shortened in the communication system as a whole.

(3) In the communication system of (1) or (2) above, the plurality of first communication parts may each transmit a signal received from the automated guided vehicle to the second communication part constituting the pair therewith, and the plurality of second communication parts may each transmit a signal input from the load ports to the first communication part constituting the pair therewith. In the present invention, the plurality of first communication parts and the plurality of second communication parts can be connected in one line. In each pair other than the communication pair, signals can thus be appropriately transmitted and received between the first communication part and second communication part constituting the pair, without directly connecting the first communication part and the second communication part by a communication line or the like.

(4) In the communication system of any of (1) to (3) above, one of the plurality of first communication parts and plurality of second communication parts may be set as a master communication part, and all the first communication parts and second communication parts other than the master communication part may each be set as a slave communication part, the master communication part may sequentially check with the plurality of slave communication parts, by polling communication, as to whether there is a transmission request, and the slave communication parts may each transmit a predetermined signal to the first communication part or second communication part constituting the pair therewith, in response to the polling communication. In this case, signals can be prevented from being transmitted at the same time from the plurality of first communication parts and the plurality of second communication parts. The occurrence of crosstalk can thereby be more appropriately prevented, even in the case where the plurality of first communication parts and the plurality of second communication parts are connected in one line.

(5) The communication system of any of (1) to (3) above may include a master communication part, the plurality of first communication parts and the plurality of second communication parts may each be set as a slave communication part, the master communication part may sequentially check with the plurality of slave communication parts, by polling communication, as to whether there is a transmission request, and the slave communication parts may each transmit a predetermined signal to the first communication part or second communication part constituting the pair therewith, in response to the polling communication. In this case, signals can be prevented from being transmitted at the same time from the plurality of first communication parts and the plurality of second communication parts. The occurrence of crosstalk can thereby be more appropriately prevented, even in the case where the plurality of first communication parts and the plurality of second communication parts are connected in one line.

(6) In the communication system of (4) or (5) above, the master communication part may store a communication history of the plurality of first communication parts. In this case, management of the communication history of the first communication parts is facilitated.

(7) In the communication system of any of (1) to (3) above, the plurality of first communication parts and the plurality of second communication parts may be set as a master communication part one by one in turn, the first communication part or second communication part set as the master communication part may transmit a signal for checking whether there is a transmission request to a slave communication part, with a predetermined one of the plurality of first communication parts and plurality of second communication parts as the slave communication part, and the slave communication part may transmit a predetermined signal to the first communication part or second communication part constituting the pair therewith, in response to the signal from the master communication part. In this case, signals can be prevented from being transmitted at the same time from the plurality of first communication parts and the plurality of second communication parts. The occurrence of crosstalk can thereby be more appropriately prevented, even in the case where the plurality of first communication parts and the plurality of second communication parts are connected in one line.

(8) The communication system of any of (1) to (7) above may include a third communication line connecting the first communication unit and the second communication unit, and the first communication line, the second communication line and the third communication line may each be a serial communication line. In this case, the wiring of the communication system can be sufficiently simplified.

(9) In order to achieve the above object, an optical transmission device according to one aspect of the present invention is an optical transmission device for use as the first communication part in the communication system of any of (1) to (8) above, including a transceiver part configured to transmit and receive optical signals, a first connection part to which is connected a communication line for transmitting signals to and receiving signals from a first external device, and a second connection part to which is connected a communication line for transmitting signals to and receiving signals from a second external device.

In the case where an optical transmission device having the above configuration is used as the first communication part of the communication system described above, a plurality of first communication parts can be easily connected in one line, by using a first connection part and a second connection part.

(10) The optical transmission device of (9) above may include an identification information setting part configured to set identification information. In this case, setting of identification information (identification information for specifying pairs) of the plurality of first communication parts is facilitated.

(11) In order to achieve the above object, a communication method according to one aspect of the present invention is a communication method in a manufacturing system including an automated guided vehicle, a substrate processing device, a first communication unit having a plurality of first communication parts configured to perform optical communication with the automated guided vehicle and connected to each other via a first communication line, and a second communication unit having a plurality of second communication parts respectively connected to a plurality of load ports of the substrate processing device and connected to each other via a second communication line, and the plurality of first communication parts each constituting a pair with a predetermined one of the plurality of second communication parts, the method including setting one of the plurality of pairs as a communication pair, and transmitting and receiving signals between the plurality of first communication parts and the plurality of second communication parts via the communication pair.

With the above communication method, signals can be transmitted and received between an automated guided vehicle and a plurality of load ports, in a state where a plurality of first communication parts of a first communication unit and a plurality of second communication parts of a second communication unit are connected in one line.

According to the present invention, the wiring between an automated guided vehicle and the load ports of a substrate processing device can be simplified.

DETAILED DESCRIPTION OF THE INVENTION

Figure 1:
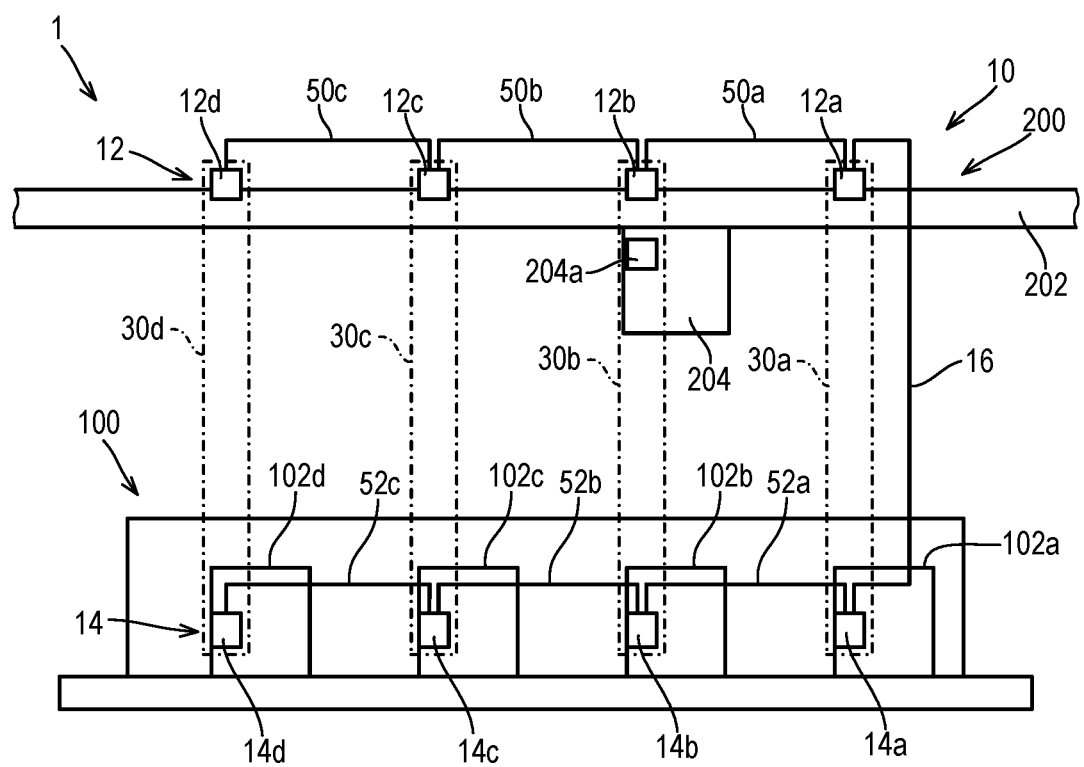
FIG. 1 is a schematic diagram showing a manufacturing system utilizing a communication system according to one embodiment of the present invention.

Hereinafter, a communication system and a communication method according to one embodiment of the present invention will be described using the drawings.
Summary of Manufacturing System FIG. 1 is a schematic diagram showing a manufacturing system that utilizes a communication system according to one embodiment of the present invention. As shown in FIG. 1, a manufacturing system 1 includes a communication system 10, a substrate processing device 100 and a transport facility 200. Various known substrate processing devices and transport facilities can be used as the substrate processing device 100 and the transfer facility 200, and thus the substrate processing device 100 and the transfer facility 200 will be briefly described first.

The substrate processing device 100 is a device that performs predetermined processing such as surface treatment on the substrate of a semiconductor product. The substrate processing device 100 includes a plurality of load ports 102a, 102b, 102c and 102d. A carrier (not shown; e.g., FOUP) housing a plurality of substrates is loaded onto each of the load ports 102a, 102b, 102c and 102d. In the manufacturing system 1, substrates are taken in to the substrate processing device 100 and substrates are taken out from the substrate processing device 100, via the carriers loaded onto the load ports 102a, 102b, 102c and 102d.

The transport facility 200 includes a track 202 and an automated guided vehicle 204 that travels along the track 202. The track 202 is provided at a position upward of the plurality of load ports 102a, 102b, 102c and 102d. In the present embodiment, the track 202 is a rail installed on the ceiling of a factory, for example, and the automated guided vehicle 204 is an overhead hoist transport (OHT), for example. The automated guided vehicle 204 has a hoist mechanism, for example. The automated guided vehicle 204 transports a carrier (not shown) along the track 202, and delivers the carrier to any one of the load ports 102a, 102b, 102c and 102d using the hoist mechanism.

The automated guided vehicle 204 includes an optical transmission device 204a that performs optical wireless communication with first communication parts 12a, 12b, 12c and 12d described later. Also, the automated guided vehicle 204 is connected to a host computer (not shown) via a wired or wireless network (not shown), and operations of the automated guided vehicle 204 are managed by the host computer. The automated guided vehicle 204 performs transportation of carriers and delivery of carriers to the load ports 102a, 102b, 102c and 102d, based on instructions that are given by the host computer. Note that operation management of the automated guided vehicle 204 by the host computer is similar to operation management of automated guided vehicles that is performed in existing substrate processing facilities, and thus a detailed description thereof will be omitted.
Configuration of Communication System Next, the communication system 10 will be described in detail. The communication system 10 includes a first communication unit 12, a second communication unit 14 and a communication line 16 connecting the first communication unit 12 and the second communication unit 14. In the present embodiment, the communication line 16 corresponds to a third communication line. The communication line 16 is a serial communication line, for example, and the first communication unit 12 and the second communication unit 14 are connected so to be able to perform serial communication with each other. Note that various known types of communication lines capable of serial communication such as a modular cable, for example, can be utilized as the communication line 16.

The first communication unit 12 includes the plurality of first communication parts 12a, 12b, 12c and 12d. The first communication parts 12a, 12b, 12c and 12d are optical transmission devices each configured to be capable of optical communication with the optical transmission device 204a of the automated guided vehicle 204. In the present embodiment, the first communication parts 12a, 12b, 12c and 12d perform parallel communication with the automated guided vehicle 204.

The first communication parts 12a, 12b, 12c and 12d are provided along the track 202 at positions upward of the load ports 102a, 102b, 102c and 102d and to be separated from each other. More specifically, the first communication parts 12a, 12b, 12c and 12d are respectively positioned above the load ports 102a, 102b, 102c and 102d.

The first communication parts 12a, 12b, 12c and 12d are connected to each other by a plurality of communication lines 50a, 50b and 50c. In the present embodiment, the communication lines 50a, 50b and 50c each correspond to a first communication line. The communication lines 50a, 50b and 50c are serial communication lines, for example, and the first communication parts 12a, 12b, 12c and 12d are connected so to be able to perform serial communication with each other. Note that various known types of communication lines capable of serial communication such as a modular cable, for example, can be utilized as the communication lines 50a, 50b and 50c.

Figure 2:
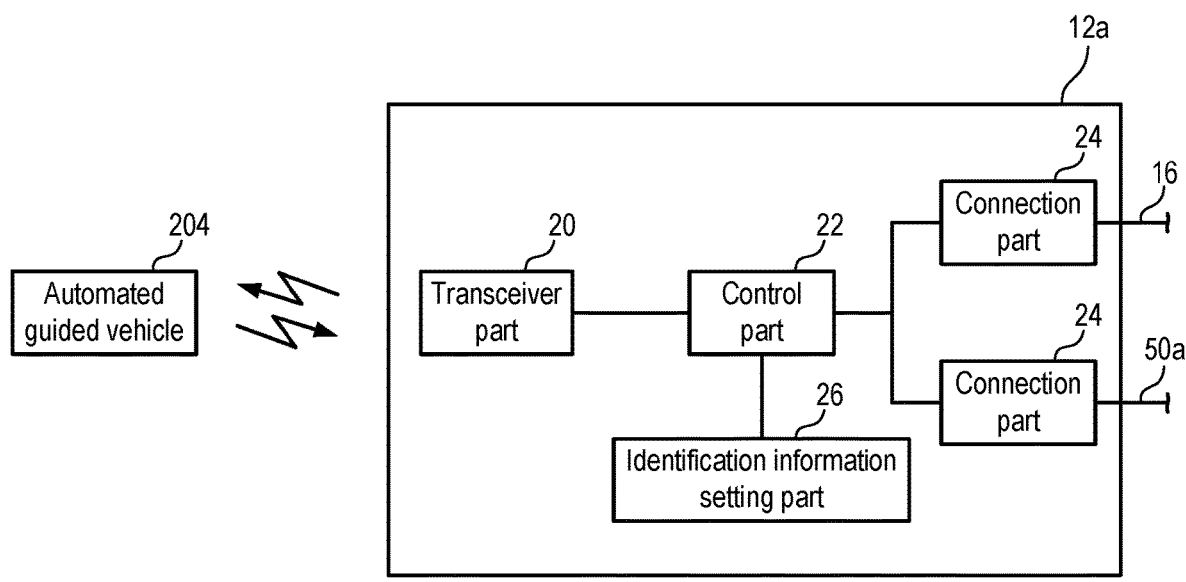
FIG. 2 is a schematic block diagram showing an example configuration of a first communication part (optical transmission device).

FIG. 2 is a schematic block diagram showing an example configuration of the first communication part (optical transmission device) 12a. As shown in FIG. 2, the first communication part 12a includes a transceiver part 20, a control part 22, a pair of connection parts 24, and an identification information setting part 26. In the present embodiment, one of the pair of connection parts 24 corresponds to a first connection part, and the other connection part 24 corresponds to a second connection part.

The transceiver part 20 transmits optical signals to and receives optical signals from the optical transmission device 204a (see FIG. 1) of the automated guided vehicle 204. In the present embodiment, the transceiver part 20 includes a light emitting element such as an LED, a light receiving element such as a photodiode, and a transceiver circuit, for example, and functions to convert electrical signals into optical signals and transmit the optical signals to the automated guided vehicle 204, and to convert optical signals received from the automated guided vehicle 204 into electrical signals. The configuration of a known optical transmission device can be utilized as the configuration of the transceiver part 20.

The control part 22 includes a CPU, a storage part (RAM, ROM) and a driver, and controls transmission and reception of signals. In the present embodiment, the control part 22 converts parallel signals input from the transceiver part 20 into serial signals, and converts serial signals input from the connection parts 24 into parallel signals. Also, the control part 22 sets identification information of the first communication part 12a. In the present embodiment, the control part 22 sets the identification information of the first communication part 12a, according to operation of the identification information setting part 26 by the user. A dip switch, for example, can be used as the identification information setting part 26. Note that the configuration of a known optical transmission device can be utilized as the configuration of the control part 22.

Although a detailed description is omitted, identification information may be set in advance in the first communication part (optical transmission device) 12a. For example, identification information may be stored in advance in a storage part such as a ROM provided in the first communication part (optical transmission device) 12a. In this case, the identification information setting part need not be provided. This similarly applies to the first communication parts 12b, 12c and 12d and second communication parts 14a, 14b, 14c and 14d.

The pair of connection parts 24 are configured to be able to connect communication lines for transmitting signals to and receiving signals from external devices. In the present embodiment, the communication line 16 is connected to one of the pair of connection parts 24, and the communication line 50a is connected to the other connection part 24. In the present embodiment, the one connection part 24 is connected to the second communication part 14a (see FIG. 1) serving as a first external device via the communication line 16, and the other connection part 24 is connected to the first communication part 12b (see FIG. 1) serving as a second external device via the communication line 50a.

Note that, although a detailed description is omitted, the first communication parts 12b, 12c and 12d each include a transceiver part 20, a control part 22, a pair of connection parts 24 and an identification information setting part 26, similarly to the first communication part 12a. The communication line 50a is connected to one connection part 24 of the first communication part 12b, and the communication line 50b is connected to the other connection part 24 thereof. The communication line 50b is connected to one connection part 24 of the first communication part 12c, and the communication line 50c is connected to the other connection part 24 thereof. The communication line 50c is connected to one connection part 24 of the first communication part 12d.

As described above, in the present embodiment, the first communication parts 12a, 12b, 12c and 12d can be connected in one line, by one connection part 24 of the first communication part 12a, the communication line 50a, the pair of connection parts 24 of the first communication part 12b, the communication line 50b, the pair of connection parts 24 of the first communication part 12c, the communication line 50c, and one connection part 24 of the first communication part 12d.

As shown in FIG. 1, the second communication unit 14 has the plurality of second communication parts 14a, 14b, 14c and 14d. The plurality of second communication parts 14a, 14b, 14c and 14d transmit signals to and receive signals from the load ports 102a, 102b, 102c and 102d.

The first communication parts 12a, 12b, 12c and 12d of the first communication unit 12 each constitute a pair with a predetermined one of the second communication parts 14a, 14b, 14c and 14d. In the present embodiment, the first communication part 12a and the second communication part 14a constitute a pair 30a, the first communication part 12b and the second communication part 14b constitute a pair 30b, the first communication part 12c and the second communication part 14c constitute a pair 30c, and the first communication part 12d and the second communication part 14d constitute a pair 30d. In the present embodiment, the pair 30a functions as a communication pair.

The second communication parts 14a, 14b, 14c and 14d are connected to each other by the plurality of communication lines 52a, 52b and 52c. In the present embodiment, the communication lines 52a, 52b and 52c each correspond to a second communication line. The communication lines 52a, 52b and 52c are serial communication lines, for example, and the second communication parts 14a, 14b, 14c and 14d are connected so to be able to perform serial communication with each other. Note that various known types of communication lines capable of serial communication such as a modular cable can be utilized as the communication lines 52a, 52b and 52c, for example.

Figure 3:
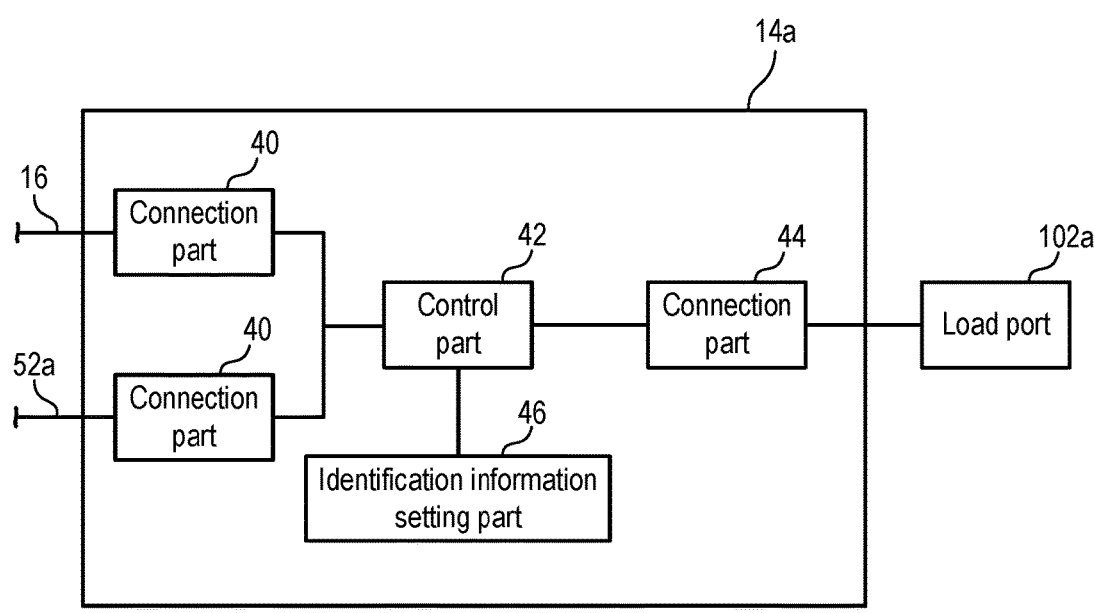
FIG. 3 is a schematic block diagram showing an example configuration of a second communication part.

FIG. 3 is a schematic block diagram showing an example configuration of the second communication part 14a. As shown in FIG. 3, the second communication part 14a includes a pair of connection parts 40, a control part 42, a connection part 44 and an identification information setting part 46.

The pair of connection parts 40 are configured to be able to connect communication lines for transmitting signals to and receiving signals from external devices. In the present embodiment, the communication line 16 is connected to one of the pair of connection parts 40, and the communication line 52a is connected to the other connection part 40. In the present embodiment, the one connection part 40 is connected to the first communication part 12a (see FIG. 1) serving as a first external device via the communication line 16, and the other connection part 40 is connected to the second communication part 14b (see FIG. 1) serving as a second external device via the communication line 52a.

The control part 42 includes a CPU, a storage part (RAM, ROM) and a driver, and controls transmission and reception of signals. In the present embodiment, the control part 42 converts serial signals input from the connection parts 40 into parallel signals, and converts parallel signals input from the connection part 44 into serial signals. Also, the control part 42 sets identification information of the second communication part 14a. In the present embodiment, the control part 42 sets the identification information of the second communication part 14a according to operation of the identification information setting part 46 by the user. A dip switch, for example, can be used as the identification information setting part 46.

The connection part 44 is connected to the load port 102a. In the present embodiment, the connection part 44 performs parallel communication with the load port 102a.

Note that, although a detailed description is omitted, the second communication parts 14b, 14c and 14d each have a pair of connection parts 40, a control part 42, a connection part 44 and an identification information setting part 46, similarly to the second communication part 14a. The communication line 52a is connected to one connection part 40 of the second communication part 14b, and the communication line 52b is connected to the other connection part 40 thereof. The connection part 44 of the second communication part 14b is connected to the load port 102b. The communication line 52b is connected to one connection part 40 of the second communication part 14c, and the communication line 52c is connected to the other connection part 40 thereof. The connection part 44 of the second communication part 14c is connected to the load port 102c. The communication line 52c is connected to one connection part 40 of the second communication part 14d. The connection part 44 of the second communication part 14d is connected to the load port 102d.

As described above, in the present embodiment, the second communication parts 14a, 14b, 14c and 14d can be connected in one line, by one connection part 40 of the second communication part 14a, the communication line 52a, the pair of connection parts 40 of the second communication part 14b, the communication line 52b, the pair of connection parts 40 of the second communication part 14c, the communication line 52c, and one connection part 40 of the second communication part 14d.

Referring to FIG. 1, the automated guided vehicle 204 communicates with a control device (not shown) provided in the substrate processing device 100 via the load ports 102a, 102b, 102c and 102d while delivering carriers to the load ports 102a, 102b, 102c and 102d. For example, at the time of transporting a carrier to the substrate processing device 100, the automated guided vehicle 204 moves to above the load port to which the carrier is to be transported, based on an instruction of the host computer not shown. The automated guided vehicle 204 then delivers the carrier while transmitting and receiving signals necessary for delivery of the carrier to and from that load port.

In the present embodiment, for example, the automated guided vehicle 204 transmits signals to and receives signals from the load port to which the carrier is to be transported, via the pair corresponding to that load port, among the plurality of pairs 30a to 30d. For example, at the time of transporting a carrier to the load port 102a, the automated guided vehicle 204 transmits signals to and receives signals from the load port 102a, via the pair 30a corresponding to the load port 102a. Although a detailed description is omitted, communication between the automated guided vehicle 204 and the load port (substrate processing device 100) is performed in accordance with an interlock sequence as defined by E84 of SEMI (Semiconductor Equipment and Materials International) standards, for example.

Note that, in the present embodiment, as described above, the first communication parts 12a, 12b, 12c and 12d are connected in one line by the plurality of communication lines 50a, 50b and 50c, and the second communication parts 14a, 14b, 14c and 14d are connected in one line by the plurality of communication lines 52a, 52b and 52c. Also, the first communication part 12a and the second communication part 14a constituting the pair 30a are communicably connected by the communication line 16. That is, in the present embodiment, the plurality of first communication parts 12a, 12b, 12c and 12d and plurality of second communication parts 14a, 14b, 14c and 14d are connected in one line by the communication lines 16, 50a, 50b, 50c, 52a, 52b and 52c.

With the above configuration, not only signals given from the automated guided vehicle 204 to the first communication part 12a and signals given from the load port 102a to the second communication part 14a but also signals given from the automated guided vehicle 204 to the first communication parts 12b, 12c and 12d and signals given from the load ports 102b, 102c and 102d to the second communication parts 14b, 14c and 14d can be transmitted and received via the pair 30a and the communication line 16.

For example, when transporting a carrier to the load port 102b, the automated guided vehicle 204 moves to above the load port 102b and then transmits and receives predetermined signals to and from the load port 102b via the pair 30b (communication parts 12b and 14b) and the pair 30a (communication parts 12a and 14a). Specifically, the first communication part 12b transmits signals given from the automated guided vehicle 204 by optical communication to the load port 102b, via the communication line 50a, the first communication part 12a, the communication line 16, the second communication part 14a, the communication line 52a and the second communication part 14b. Also, the second communication part 14b transmits the signal given from the load port 102b to the automated guided vehicle 204, via the communication line 52a, the second communication part 14a, the communication line 16, the first communication part 12a, the communication line 50a and the first communication part 12b.

In this way, in the present embodiment, rather than the first communication part 12b and the second communication part 14b, the first communication part 12c and the second communication part 14c, and the first communication part 12d and the second communication part 14d being set to be directly communicable by communication lines or the like, signals can be transmitted and received between the first communication parts 12*b*, 12*c* and 12*d* and the second communication parts 14*b*, 14*c* and 14*d*, via the first communication part 12*a* and the second communication part 14*a*. In other words, in the present embodiment, by configuring the first communication part and the second communication part constituting one pair (in the present embodiment, pair 30*a*) to be directly communicable, among the plurality of pairs 30*a*, 30*b*, 30*c* and 30*d*, communication between the first communication parts and the second communication parts constituting the other pairs is possible. The wiring between the automated guided vehicle 204 and the load ports 102*a*, 102*b*, 102*c* and 102*d* can thereby be simplified. In this case, the task of connecting the first communication unit 12 and the second communication unit 14 is facilitated, and crosstalk caused by noise can be prevented from occurring at the time of transmitting and receiving signals between the first communication unit 12 and the second communication unit 14.

Note that, in the present embodiment, the spacing between adjacent first communication parts and the spacing between adjacent second communication parts are sufficiently small, compared to the spacing between the first communication parts 12*a* to 12*d* and the second communication parts 14*a* to 14*d*. In this regard, in the present embodiment, the communication lines 50*a* to 50*c* connecting the first communication parts 12*a* to 12*d* and the communication lines 52*a* to 52*c* connecting the second communication parts 14*a* to 14*d* are necessary, but, as described above, long communication lines do not need to be laid to respectively connect the first communication parts 12*a* to 12*d* and the second communication parts 14*a* to 14*d* separately. In this case, laying of a plurality of long communication lines can be eliminated compared to the case where the first communication parts 12*a* to 12*d* and the second communication parts 14*a* to 14*d* are respectively connected separately, and thus the total length of the communication lines can be shortened in the communication system 10 as a whole. The installation cost of the communication system 10 can thereby be reduced.

Also, in the present embodiment, space for the automated guided vehicle 204 to move needs to be secured between the first communication unit 12 and the second communication unit 14. In this regard, in the present embodiment, the first communication parts 12*a* to 12*d* and the second communication parts 14*a* to 14*d* do not need to be respectively connected separately as described above. In this case, the degree of freedom in the layout of the communication system 10 is increased, compared to the case where the first communication parts 12*a* to 12*d* and the second communication parts 14*a* to 14*d* are respectively connected separately. Space for the automated guided vehicle 204 to move can thereby be easily secured between the first communication unit 12 and the second communication unit 14. As a result, the task of installing of the communication system 10 is facilitated.

Also, in the present embodiment, the overhead hoist transport 204 is used. The spacing between the track of the automated guided vehicle 204 and the load ports 102*a*, 102*b*, 102*c* and 102*d* is thus larger. In this case, the spacing between the first communication unit 12 and the second communication unit 14 is also larger. However, in the present embodiment, the first communication parts 12*a* to 12*d* and the second communication parts 14*a* to 14*d* do not need to be respectively connected separately as described above. In other words, a plurality of long communication lines do not need to be laid to connect the plurality of first communication parts 12*a* to 12*d* and the plurality of second communication parts 14*a* to 14*d* separately. Even if the spacing between the first communication unit 12 and the second communication unit 14 increases, the first communication unit 12 and the second communication unit 14 can thus be easily connected. Also, the total length of the communication lines can be sufficiently shortened in the communication system 10 as a whole. The installation cost of the communication system 10 can thereby be reduced.

Example of Communication by Communication System

Note that, in the case where the transport facility includes a plurality of automated guided vehicles, there may be times when the plurality of automated guided vehicles transmit signals to the plurality of first communication parts at the same time or within a short time span. Also, there may be times when the plurality of load ports transmit signals to the plurality of second communication parts at the same time or within a short time span. In such cases, crosstalk could possibly occur due the plurality of first communication parts outputting signal at the same time or the plurality of second communication parts outputting signals at the same time. In view of this, in the communication system 10 according to the present embodiment, an opportunity to transmit signals is given in turn to the plurality of first communication parts 12*a*, 12*b*, 12*c* and 12*d* and the plurality of second communication parts 14*a*, 14*b*, 14*c* and 14*d*, in order to prevent the occurrence of such crosstalk.

Specifically, in the communication system 10 according to the present embodiment, one of the plurality of first communication parts and plurality of second communication parts is set as a master communication part, and all the other first communication parts and second communication parts are set as slave communication parts. The master communication part then sequentially checks with the plurality of slave communication parts, by polling communication, as to whether there is a transmission request, and the slave communication parts each transmit a predetermined signal to the first communication part or second communication part constituting a pair therewith, in response to the polling communication. Hereinafter, an example of a communication method of the communication system 10 that utilizes polling communication will be described.

Figure 4:
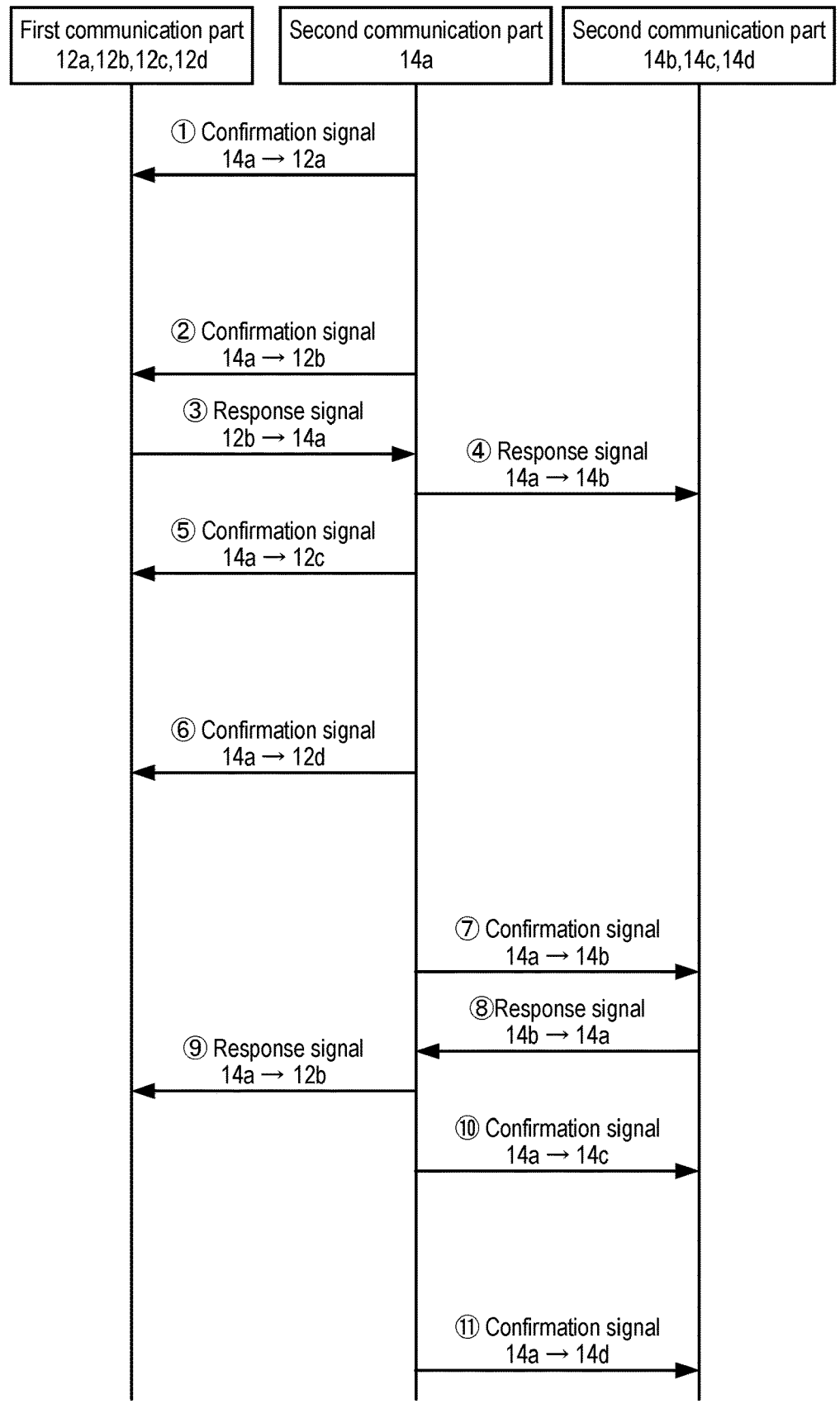
FIG. 4 is a diagram for describing a communication example using polling communication.

FIG. 4 is a diagram for describing a communication example that utilizes polling communication. Note that FIG. 4 shows a communication example of the case where the second communication part 14*a* is set as the master communication part, and the first communication parts 12*a*, 12*b*, 12*c* and 12*d* and the second communication part 14*b*, 14*c* and 14*d* are set as the slave communication parts. Also, FIG. 4 shows a communication example of the case where the automated guided vehicle 204 (see FIG. 1) transmits signals to and receives signals from the load port 102*b* (see FIG. 1). Note that, in the communication example shown below, it is assumed that, first, a signal is transmitted from the automated guided vehicle 204 to the load port 102*b* via the first communication part 12*b*, and the load port 102*b* transmits a signal to the automated guided vehicle 204 via the second communication part 14*b*, in response to the signal transmitted from the automated guided vehicle 204.

In the communication example shown in FIG. 4, the control part 42 (see FIG. 3) of the second communication part (master communication part) 14*a* transmits signals (confirmation signals numbered 1, 2, 5, 6, 7, 10 and 11 in FIG. 4) for checking with the first communication part 12*a*, the first communication part 12*b*, the first communication part 12*c*, the first communication part 12*d*, the second communication part 14*b*, the second communication part 14c and the second communication part 14d, in this order, as to whether there is a transmission request. Note that the master communication part may transmit the confirmation signal to a slave communication part every predetermined time period, or may transmit the confirmation signal to the next slave communication part, in the case of receiving a response signal or a signal indicating that there is no signal to be transmitted from a slave communication part.

Here, in the example shown in FIG. 4, a signal is transmitted from the automated guided vehicle 204 (see FIG. 1) to the first communication part 12b, as described above. In response to the confirmation signal from the second communication part 14a (confirmation signal numbered 2 in FIG. 4), the first communication part 12b thus transmits a signal to the second communication part 14b constituting a pair therewith (response signals numbered 3 and 4 in FIG. 4). The second communication part 14b transmits the input response signal to the load port 102b (see FIG. 1).

Note that, in the present embodiment, identification information of the master communication part (second communication part 14a in FIG. 4) and identification information of the second communication part (second communication part 14b in FIG. 4) serving as the transmission target is attached to the response signal that is transmitted from the first communication part (first communication part 12b in FIG. 4). Based on this identification information, the response signal that is transmitted from the first communication part is transmitted to the master communication part, and is then transmitted from the master communication part to the second communication part. Note that, although a detailed description is omitted, a signal may be transmitted directly from the first communication part to the second communication part serving as the transmission target.

Also, in the example shown in FIG. 4, the load port 102b (see FIG. 1) transmits a signal to the second communication part 14b, in response to the signal from the automated guided vehicle 204, as described above. In response to the confirmation signal from the second communication part 14a (confirmation signal numbered 7 in FIG. 4), the second communication part 14b thus transmits a signal (response signals numbered 8 and 9 in FIG. 4) to the first communication part 12b constituting a pair therewith. The first communication part 12b transmits the input response signal to the automated guided vehicle 204.

Note that, in the present embodiment, identification information of the master communication part (second communication part 14a in FIG. 4) and identification information of the first communication part (first communication part 12b in FIG. 4) serving as the transmission target is attached to the response signal that is transmitted from the second communication part (second communication part 14b in FIG. 4). Based on this identification information, the response signal that is transmitted from the second communication part is transmitted to the master communication part, and is then transmitted from the master communication part to the first communication part. Note that, although a detailed description is omitted, a signal may be transmitted directly from the second communication part to the first communication part serving as the transmission target.

In the present embodiment, by utilizing polling communication as described above, signals can be prevented from being transmitted at the same time from the plurality of first communication parts 12a, 12b, 12c and 12d and the plurality of second communication parts 14a, 14b, 14c and 14d. Crosstalk can thereby be prevented from occurring, even when the plurality of first communication parts 12a, 12b, 12c and 12d and the plurality of second communication parts 14a, 14b, 14c and 14d are connected in one line.

Note that, in the communication system 10 according to the present embodiment, the first communication unit 12 and the second communication unit 14 are connected in one line, and thus, in the case where polling communication is utilized as described above, the communication history of the plurality of first communication parts and the plurality of second communication parts can be stored in the storage part of the master communication part. In this case, management of the communication history of the plurality of first communication parts and the plurality of second communication parts is facilitated.

In the example shown in FIG. 4, the case where the second communication part 14a is set as the master communication part was described, but any of the first communication parts 12a, 12b, 12c and 12d and the second communication parts 14b, 14c and 14d may be set as the master communication part. Also, the order in which the master communication part checks for a transmission request with the slave communication part is not limited to the above-described example. For example, the second communication part 14a serving as the master communication part may check for a transmission request with the first communication part 12a, the second communication part 14b, the first communication part 12b, the second communication part 14c, the first communication part 12c, the second communication part 14d and the first communication part 12d in this order.

Although not shown in FIG. 4, when a signal is transmitted to the master communication part from the automated guided vehicle or a load port, the master communication part transmits the signal input from the automated guided vehicle or the load port to the communication part serving as the transmission target at a different timing to the timing at which the confirmation signal is transmitted to other communication parts.

Note that, in the above example, the first communication part 12a and the second communication part 14a of the pair 30a are connected by the communication line 16, but the first communication part and the second communication part of any of the other pairs 30b, 30c and 30d may be connected by the communication line 16, instead of the first communication part 12a and the second communication part 14a. In this case, the first communication part and the second communication part connected by the communication line 16 will be the communication pair.

Variations

Figure 5:
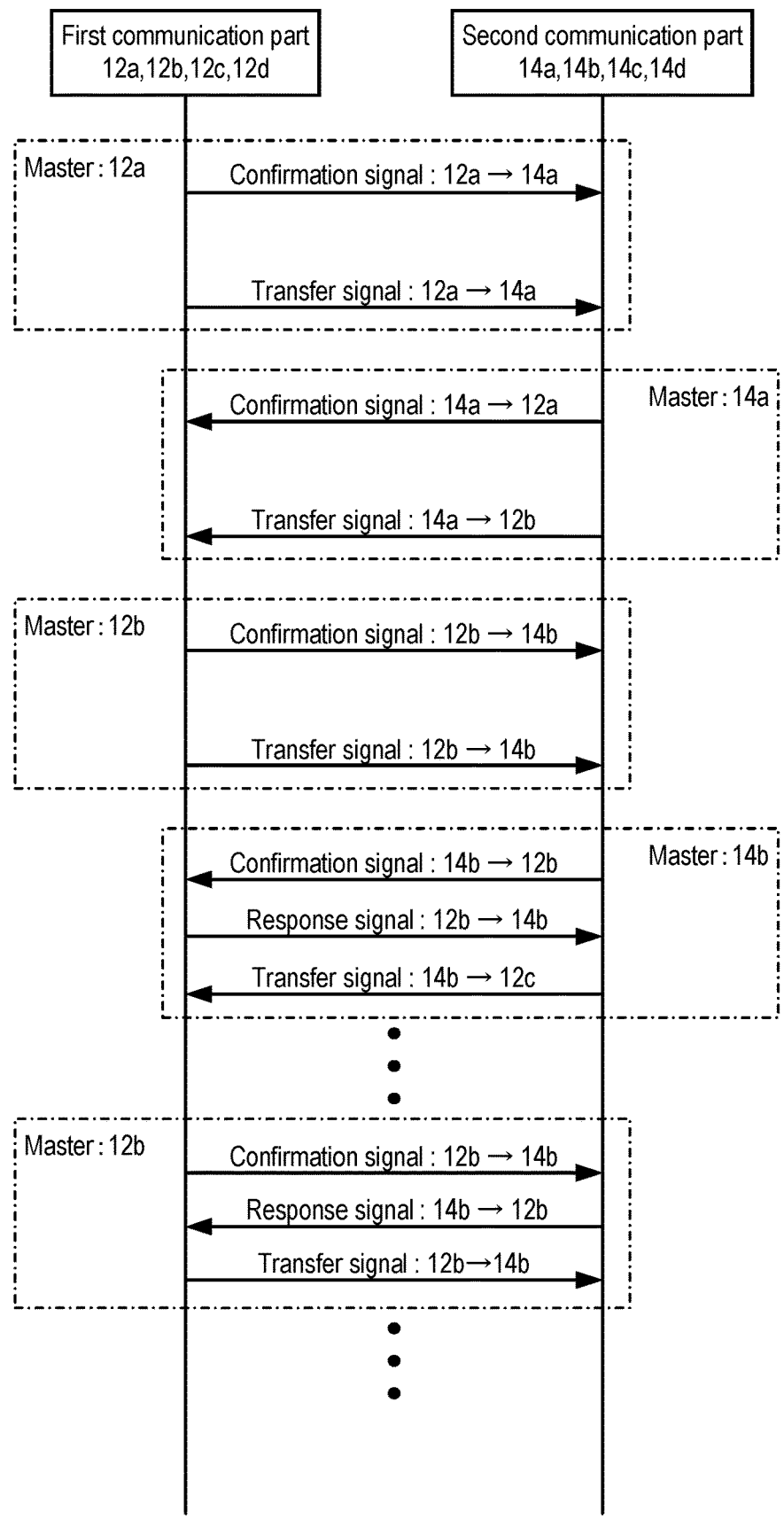
FIG. 5 is a diagram for describing a communication example in the case where a plurality of first communication parts and a plurality of second communication parts are set as a master communication part one by one in turn.

In the example embodiment described above, the case where one of the plurality of first communication parts 12a, 12b, 12c and 12d and the plurality of second communication parts 14a, 14b, 14c and 14d is set as the master communication part was described, but the plurality of first communication parts 12a, 12b, 12c and 12d and the plurality of second communication parts 14a, 14b, 14c and 14d may be set as the master communication part one by one in turn. FIG. 5 is a diagram for describing a communication example of the case where the first communication parts 12a, 12b, 12c and 12d and the second communication parts 14a, 14b, 14c and 14d are set as the master communication part one by one in turn.

Note that FIG. 5 shows a communication example of the case where the first communication part 12a, the second communication part 14a, the first communication part 12b, the second communication part 14b, the first communication part 12c, the second communication part 14c, the first communication part 12d and the second communication part 14*d* are set as the master communication part in this order. Note that, in the communication example shown below, it is assumed that, first, a signal is transmitted from the automated guided vehicle 204 to the load port 102*b* via the first communication part 12*b*, and the load port 102*b* transmits a signal to the automated guided vehicle 204 via the second communication part 14*b*, in response to the signal transmitted from the automated guided vehicle 204.

In the communication example shown in FIG. 5, first, the first communication part 12*a* is set as the master communication part, and a signal (confirmation signal) for checking whether there is a transmission request is transmitted from the first communication part 12*a* to the second communication part 14*a*. Also, the first communication part 12*a* transmits, to the second communication part 14*a*, a signal (transfer signal) indicating that the position of master communication part is to be transferred. Having received the confirmation signal and the transfer signal from the first communication part 12*a*, the second communication part 14*a*, in the case of not having a signal to be transmitted, transmits a confirmation signal to the first communication part 12*a* as the master communication part, and transmits a transfer signal to the first communication part 12*b*.

In this way, in this communication example, confirmation signals and transfer signals are transmitted to the plurality of first communication parts 12*a*, 12*b*, 12*c* and 12*d* and the plurality of second communication parts 14*a*, 14*b*, 14*c* and 14*d*, in accordance with a preset order.

Here, in the example shown in FIG. 5, a signal is transmitted from the automated guided vehicle 204 (see FIG. 1) to the first communication part 12*b*, as described above. The first communication part 12*b* thus transmits a response signal to the second communication part 14*b* constituting a pair therewith, in response to a confirmation signal from the second communication part 14*b* serving as the master communication part. The second communication part 14*b* transmits the input response signal to the load port 102*b* (see FIG. 1).

Also, in the example shown in FIG. 5, the load port 102*b* (see FIG. 1) transmits a signal to the second communication part 14*b*, in response to the signal from the automated guided vehicle 204, as described above. Upon receiving a confirmation signal from the first communication part 12*b* serving as the master communication part, in a state where a signal has been input from the load port 102*b*, the second communication part 14*b* transmits a response signal to the first communication part 12*b* in response to the confirmation signal. The first communication part 12*b* transmits the input response signal to the automated guided vehicle 204.

Note that the master communication part may transmit the confirmation signal and the transfer signal as separate signals or may transmit the confirmation signal and the transfer signal as a series of signals. Also, the master communication part may repeatedly transmit the confirmation signal to the slave communication parts every predetermined time period. Also, the master communication part may transmit the transfer signal to the communication part next in order when a preset time period has elapsed after transmitting the confirmation signal to a slave communication part, or may transmit the transfer signal to the slave communication part next in order, in the case of receiving a response signal or a signal indicating that there is no signal to be transmitted from a slave communication part.

In the case where the plurality of communication parts are set as the master communication part in turn as shown in FIG. 5, signals can be prevented from being transmitted at the same time from the plurality of communication parts. Crosstalk can thereby be prevented from occurring, even when the plurality of first communication parts 12*a*, 12*b*, 12*c* and 12*d* and the plurality of second communication parts 14*a*, 14*b*, 14*c* and 14*d* are connected in one line.

Note that, although a detailed description is omitted, a configuration may be adopted in which signals are sequentially output from the plurality of first communication parts 12*a*, 12*b*, 12*c* and 12*d* and the plurality of second communication parts 14*a*, 14*b*, 14*c* and 14*d* in preset order, without providing a master communication part. From the viewpoint of sufficiently avoiding the effects of noise, crosstalk and the like, however, communication in which a master communication part is set is preferably performed, as illustrated with FIGS. 4 and 5.

Figure 6:
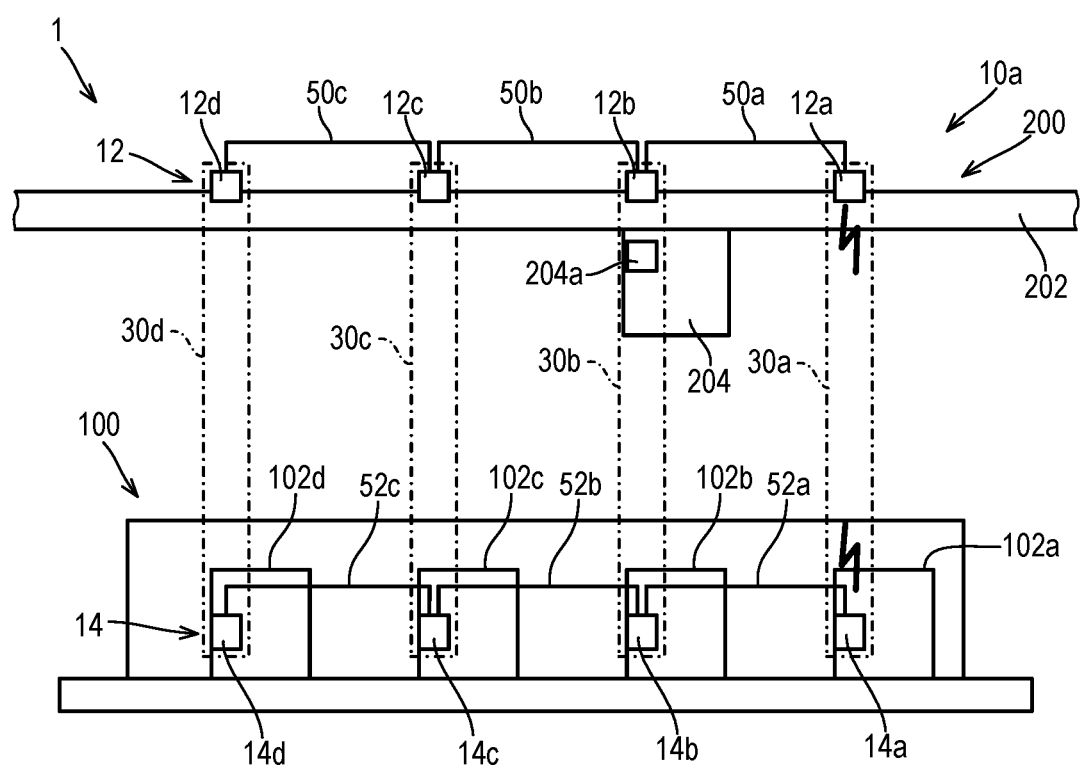
FIG. 6 is a diagram showing a variation of the communication system.

FIG. 6 is a diagram showing a variation of the communication system. In a communication system 10*a* shown in FIG. 6, the first communication part 12*a* and the second communication part 14*a* are configured to be able to communicate wirelessly.

In the communication system 10*a*, the first communication part 12*a* and the second communication part 14*a* each have a wireless communication function, and the first communication part 12*a* and the second communication part 14*a* are configured to be able to communicate with each other wirelessly. That is, in the communication system 10*a*, the first communication unit 12 and the second communication unit 14 are connected in one line, similarly to the communication system 10 described above. The operation and effect obtained with the communication system 10*a* is thereby similar to the communication system 10. Also, the communication system 10*a* does not require a communication line connecting the first communication unit 12 and the second communication unit 14, and thus installation of the communication system 10*a* is further facilitated.

Note that, in the communication system 10*a*, the first communication part and the second communication part of the pair 30*b*, the pair 30*c* or the pair 30*d* may be configured to be able to communicate wirelessly, instead of the pair 30*a*. Also, a configuration may be adopted in which a wireless communication device is provided as a separate device from the first communication parts 12*a*, 12*b*, 12*c* and 12*d* and the second communication parts 14*a*, 14*b*, 14*c* and 14*d*, and any of the pairs 30*a*, 30*b*, 30*c* and 30*d* are able to communicate wirelessly.

Figure 7:
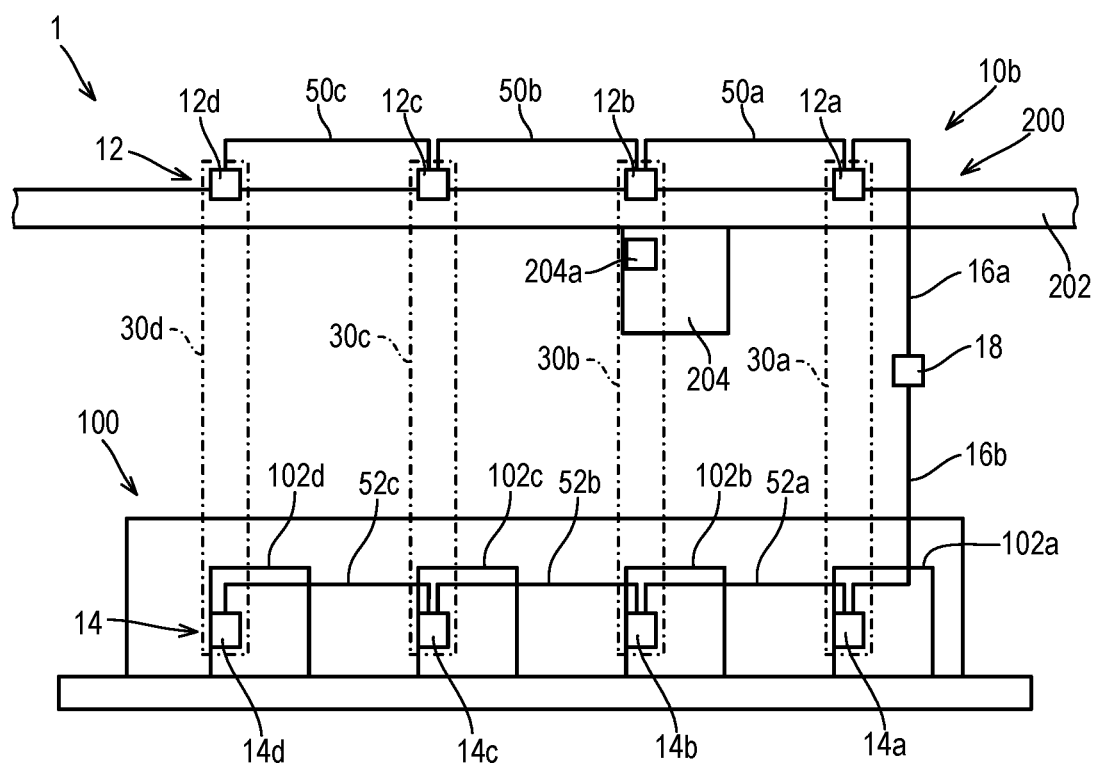
FIG. 7 is a diagram showing another variation of the communication system.

FIG. 7 is a diagram showing another variation of the communication system. In the communication system 10 described above, one of the first communication parts 12*a*, 12*b*, 12*c* and 12*d* and the second communication parts 14*a*, 14*b*, 14*c* and 14*d* is set as the master communication part, but, in a communication system 10*b* shown in FIG. 7, a master communication part 18 is provided separately to the first communication parts 12*a*, 12*b*, 12*c* and 12*d* and the second communication parts 14*a*, 14*b*, 14*c* and 14*d*. The master communication part 18 and the first communication part 12*a* are connected by a communication line 16*a*, and the master communication part 18 and the second communication part 14*a* are connected by a communication line 16*b*. The communication lines 16*a* and 16*b* are similar communication lines to the communication line 16 described above.

In the communication system 10*b*, the first communication part 12*a* and the second communication part 14*a* are connected via the communication line 16*a*, the master communication part 18 and the communication line 16*b*. That is, in the communication system 10*b*, the first communication unit 12 and the second communication unit 14 are connected in one line, similarly to the communication system 10 described above. The operation and effect obtained with the communication system 10*b* is thereby similar to the communication system 10.

Note that, in the case where polling communication is utilized in the communication system 10*b*, the first communication parts 12*a*, 12*b*, 12*c* and 12*d* and the second communication parts 14*a*, 14*b*, 14*c* and 14*d* are set as slave communication parts. The control part of the master communication part 18 sequentially checks with the plurality of slave communication parts, by polling communication, as to whether there is a transmission request, and the slave communication parts each transmit a predetermined signal to the first communication part or second communication part constituting a pair therewith, in response to the polling communication.

Note that the case where the present invention is applied to the four load ports 102*a*, 102*b*, 102*c* and 102*d* of the substrate processing device 100 was described above, but the number of load ports to which the present invention applies is not limited to four, and may be two, three, five or more. The first communication parts and the second communication parts are provided in correspondence with the load ports, and thus the number of first communication parts and second communication parts may also be two, three, five or more. The present invention can also be applied to the plurality of load ports of a plurality of substrate processing devices.

LIST OF REFERENCE SIGNS

1 Manufacturing system
10, 10*a*, 10*b* Communication system
12 First communication unit
12*a*, 12*b*, 12*c*, 12*d* First communication part
14 Second communication unit
14*a*, 14*b*, 14*c*, 14*d* Second communication part
16, 16*a*, 16*b* Communication line
18 Master communication part
20 Transceiver part
22 Control part
24 Connection part
26 Identification information setting part
30*a*, 30*b*, 30*c*, 30*d* Pair
40 Connection part
42 Control part
44 Connection part
46 Identification information setting part
100 Substrate processing device
102*a*, 102*b*, 102*c*, 102*d* Load port
200 Transport facility
202 Track
204 Automated guided vehicle
204*a* Optical transmission device

What is claimed is:

1. A communication system for transmitting and receiving signals between an automated guided vehicle and a load port of a substrate processing device, the system comprising:
a first communication unit having a plurality of first communication parts configured to perform optical communication with the automated guided vehicle and connected to each other via a first communication line; and
a second communication unit having a plurality of second communication parts respectively connected to a plurality of load ports and connected to each other via a second communication line,
wherein the plurality of first communication parts each constitute a pair with a predetermined one of the plurality of second communication parts, and
one of the plurality of pairs is set as a communication pair, and signals are transmitted and received between the plurality of first communication parts and the plurality of second communication parts via the communication pair.

2. The communication system according to claim 1, wherein the automated guided vehicle is an overhead hoist transport configured to move along a track provided at a position upward of the plurality of load ports, and
the plurality of first communication parts are provided along the track at positions upward of the plurality of load ports and to be separated from each other.

3. The communication system according to claim 1, wherein the plurality of first communication parts each transmit a signal received from the automated guided vehicle to the second communication part constituting the pair therewith, and the plurality of second communication parts each transmit a signal input from the load ports to the first communication part constituting the pair therewith.

4. The communication system according to claim 1, wherein one of the plurality of first communication parts and plurality of second communication parts is set as a master communication part, and all the first communication parts and second communication parts other than the master communication part are each set as a slave communication part,
the master communication part sequentially checks with the plurality of slave communication parts, by polling communication, as to whether there is a transmission request, and
the slave communication parts each transmit a predetermined signal to the first communication part or second communication part constituting the pair therewith, in response to the polling communication.

5. The communication system according to claim 1, comprising:
a master communication part,
wherein the plurality of first communication parts and the plurality of second communication parts are each set as a slave communication part,
the master communication part sequentially checks with the plurality of slave communication parts, by polling communication, as to whether there is a transmission request, and
the slave communication parts each transmit a predetermined signal to the first communication part or second communication part constituting the pair therewith, in response to the polling communication.

6. The communication system according to claim 4, wherein the master communication part stores a communication history of the plurality of first communication parts.

7. The communication system according to claim 5, wherein the master communication part stores a communication history of the plurality of first communication parts.

8. The communication system according to claim 1, wherein the plurality of first communication parts and the plurality of second communication parts are set as a master communication part one by one in turn,
the first communication part or second communication part set as the master communication part transmits a signal for checking whether there is a transmission request to a slave communication part, with a predetermined one of the plurality of first communication parts and plurality of second communication parts as the slave communication part, and the slave communication part transmits a predetermined signal to the first communication part or second communication part constituting the pair therewith, in response to the signal from the master communication part.

9. The communication system according to claim 1, comprising:

a third communication line connecting the first communication unit and the second communication unit, wherein the first communication line, the second communication line and the third communication line are each a serial communication line.

10. An optical transmission device for use as the first communication part in the communication system according to claim 1, comprising:

a transceiver part configured to transmit and receive optical signals;

a first connection part to which is connected a communication line for transmitting signals to and receiving signals from a first external device; and a second connection part to which is connected a communication line for transmitting signals to and receiving signals from a second external device.

11. The optical transmission device according to claim 10, comprising:

an identification information setting part configured to set identification information.

12. A communication method in a manufacturing system including an automated guided vehicle, a substrate processing device, a first communication unit having a plurality of first communication parts configured to perform optical communication with the automated guided vehicle and connected to each other via a first communication line, and a second communication unit having a plurality of second communication parts respectively connected to a plurality of load ports of the substrate processing device and connected to each other via a second communication line, and the plurality of first communication parts each constituting a pair with a predetermined one of the plurality of second communication parts, the method comprising:

setting one of the plurality of pairs as a communication pair; and transmitting and receiving signals between the plurality of first communication parts and the plurality of second communication parts via the communication pair.

* * * * *